May 22, 1951 E. S. PURINGTON 2,553,673
DYNAMIC COMPRESSOR AMPLIFIER
Filed April 16, 1948
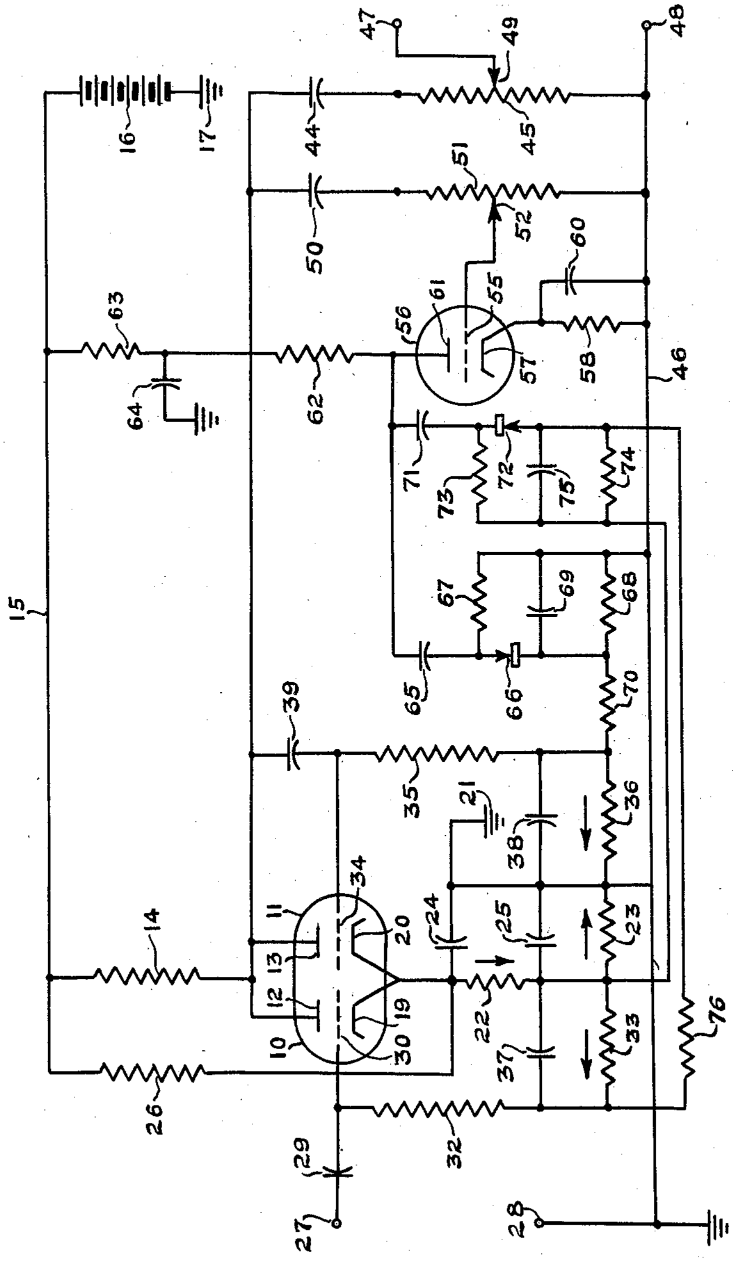
Inventor
ELLISON S. PURINGTON.
By [signature]
Attorney Patented May 22, 1951 2,553,673

UNITED STATES PATENT OFFICE 2,553,673

DYNAMIC COMPRESSOR AMPLIFIER

Ellison S. Purington, Gloucester, Mass., assignor to John Hays Hammond, Jr., Gloucester, Mass.

Application April 16, 1948, Serial No. 21,375

3 Claims. (Cl. 179—171)

This invention relates to compressor circuits for compressing the dynamic range of the signal in the output circuit of an electronic amplifier and has for an object to provide a circuit of the above type having novel and improved operating characteristics.

Another object is to provide a circuit of the above type having improved efficiency of operation and in which the thump effect and the effect of the control voltage upon the output is eliminated.

Various other objects and advantages will be apparent as the nature of the invention is more fully disclosed.

In a class A amplifier or in a dynamic expander amplifier, an electronic tube usually operates with considerable efficiency for strongest signals, but in a dynamic compressor amplifier the electronic tube usually must operate at very low efficiency under all conditions. Thus in a compressor using a triode tube and grid bias control, the tube functions as a class A amplifier for very weak signals, but as the signals increase the grid is driven toward cutoff so that the tube gain, the possible input signal and the output are highly reduced. The ratio of bias change to input grid swing may be so large that considerable care must be taken to prevent the output from containing serious transient pulses and low audio frequency signals caused by the bias changing voltage.

One method of minimizing this effect is to use two dynamic tubes in push-pull, with grid signals inserted out of phase by use for example of a transformer or phase inverter tube, and with the plates out of phase for the signal but in phase for the transient pulses. By using a push-pull output transformer, with either push-pull or single ended secondaries, the ratio of signal to transient disturbances may be greatly improved. Each tube, however, operates in substantially the same manner as before as regards grid input swing, and dynamic range.

In the present invention provision is made for utilizing two triodes in a single ended arrangement as distinguished from a push-pull arrangement, providing thump and transient elimination without requiring input or output transformers. The invention also provides for very greatly increased performance as regards grid input swing and dynamic range. The second of the two triodes is not used merely for providing thump reduction as in conventional push-pull circuits but makes its own important contribution to the compression operation. The functioning is somewhat analogous to that of a manually controlled L pad attenuator inserted between a signal source and a signal load, with one tube representing the series arm of the L pad and increasing in internal impedance as the signal increases, and the other tube representing the shunt arm of the L pad and decreasing in internal impedance as the signal increases. In addition, the shunt arm of the pad is made of especially low impedance for strong signals by use of a feedback arrangement, thereby increasing greatly the amount of compression possible.

In accordance with the present invention the single-ended dynamic compressor amplifier includes a pair of triodes with plates and cathodes in parallel with a common plate feed and a common external output circuit. The input signal is impressed upon the grid of the first triode. Control voltages are derived from the output circuit by means of a rectifier network and are applied to the grid return paths of the two triodes in opposite sense so that an increased signal serves to decrease the conductance and plate current of the first triode, but increases the conductance and plate current of the second triode in such a manner that the total plate current drawn by the two tubes remains substantially constant. The decrease in conductance of the first tube thus reduces the amplification factor and results in a certain amount of dynamic compression. The increase in conductance of the second tube increases this effect by providing a shunt path of lower conductance across the output of the first tube. Hence the combined effect may be adjusted to provide the desired amount of dynamic compression without requiring either of the tubes to be overcontrolled. In addition, a feedback is taken from the common plate circuit of the tubes to the grid of the second tube in a sense to increase the range of effective internal impedance of the second tube for a given change of plate current. This feedback may have frequency selection characteristics if desired so that the compression may be varied for different frequencies as required for obtaining the proper acoustical effect.

The novel features which are characteristic of this invention will be better understood by referring to the following description, taken in connection with the accompanying drawings in which a specific embodiment thereof has been set forth for purposes of illustration.

In the drawings the figure is a schematic diagram of a dynamic compressor system embodying the present invention.

In the embodiment shown in the drawing two dynamic triodes 10—11 have their plates 12, 13 connected together and connected through a feed resistor 14 and lead 15 to the positive end of a battery 16, the negative end of which is grounded at 17. The cathodes 19, 20 of the triodes 10—11 are also connected together and connected to ground at 21 through cathode resistors 22 and 23 by-passed by capacitors 24 and 25. A bleeder resistor 26 may be connected from the positive end of battery 16 to the cathodes 19, 20 of triodes 10—11. Input terminals 27 and 28 are connected through capacitor 29 to the grid 30 of triode 10, and to ground respectively. The grid 30 of triode 10 is connected through resistor 32 from which it receives its audio signal voltage and a resistor 33 from which it receives its automatic control voltage, to the junction of resistors 22 and 23, so that in the absence of a control voltage, the grid 30 is positive with respect to ground due to the voltage drop in resistor 23, but is not up to the cathode potential due to the biasing resistor 22. The grid 34 of tube 11 is connected through the resistor 35 from which it receives its own audio signal voltage and a resistor 36 from which it receives its automatic control to the grounded end of resistor 23, so that in the absence of control voltage, the grid 34 of triode 11 is biased at ground and therefore more negatively than the grid 30 of triode 10.

The currents in the control resistors 33 and 36, which are by-passed by smoothing and timing capacitors 37 and 38, are such that the control voltages produced thereby increase the negative bias on triode 10 and decrease the negative bias on triode 11. An increase in control voltages thus cuts down the gain of the system by decreasing the gain of triode 10 and increasing the proportion of amplified output of triode 10 that flows through the shunting triode 11. The effect is further increased by use of a feedback capacitor 39 connected from the plate lead of triodes 10 and 11 to the grid 34 which is more effective to increase the shunting effect as the effect itself becomes greater.

The plates 12 and 13 of triodes 10 and 11 are connected through output blocking capacitor 44 to one end of a volume control potentiometer 45, the other end of which is connected to a ground lead 46. Output terminals 47 and 48 are connected between the variable tap 49 of the potentiometer and the ground lead 46. The plate lead of triodes 10 and 11 is also connected through a blocking and signal selecting capacitor 50 to one end of the dynamic control potentiometer 51, the other end of which is connected to the ground lead 46.

A variable tap 52 on the potentiometer 51 is connected to the grid 55 of a driver triode 56, the cathode 57 of which is connected to the ground lead 46 through a resistor 58 and a bypass capacitor 60, and the plate 61 of which is connected through feed resistor 62 and decoupling resistor 63 to the positive lead 15 of battery 16, and the junction of resistors 62 and 63 is connected to ground through a bypass capacitor 64. The plate 61 of rectifier driver triode 56 is connected through a capacitor 65 to the anode of rectifier 66 which is also connected through a resistor 67 to the ground lead 46. The cathode of rectifier 66 is connected through a resistor 68, shunted by a filtering and timing capacitor 69 to the ground lead 46, and also through a resistor 70 to the junction of resistors 35 and 36.

Similarly the plate 61 of the rectifier driver tube 56 is connected through a capacitor 71 to the cathode of a rectifier 72, which is also connected through resistor 73 to the junction of resistors 22 and 23. The anode of rectifier 72 is connected through a resistor 74, shunted by a capacitor 75, to said junction of resistors 22 and 23, and also through a resistor 76 to the junction of resistors 32 and 33.

In operation, the conductance of tube 10 is large and that of tube 11 is weak for small input signals, so that the system amplifies well especially because the feedback coupling 39 is ineffective to react upon the plate current of triode 11. As the signal input increases, a part of the signal output of triodes 10 and 11 in parallel is impressed on the rectifier driver 56, which operates the rectifiers 66 and 72 and associated circuits in such a manner that the bias on triode 10 is increased and that on triode 11 is diminished, so that the amplification gain of the triodes 10 and 11 in parallel is diminished. The circuit may be so designed that the D. C. space currents of triodes 10 and 11 add up to the same amount regardless of the amount of rectified control, so that sudden changes in the A. C. output of the amplifier do not cause pulses of control signal in the output. The value of the rectifier driver decoupling capacitor and of the setting of the potentiometer 51 may be so chosen that the changes of bias on triodes 10 and 11 are not excessive, or limiting devices may be used for this purpose. The entire variation of amplifier gain may be seated in this single stage compressor, or the circuit shown may be followed by a similar circuit or other compressor stage.

Frequency characteristics by choice of the feedback coupling 39, may provide a greater compression on some frequencies than on others. Thus it is within the scope of this invention to provide more compression on low frequencies than on high through use of a low pass feedback in place of capacitor 39. Frequency characteristics in the control circuit may be established by suitable choices of constants so that the compression is in accordance with the acoustical value and not the electrical value of the signal in the output of the system.

What is claimed is:

1. A dynamic compressor amplifier system comprising a pair of electronic tubes having plates, cathodes and control grids, said plates being connected together and said cathodes being connected together to provide parallel space circuit paths for said tubes, a common output circuit connected to said plates, a common cathode impedance connected between said cathodes and a point of fixed reference voltage, a source of plate voltage having a positive and a negative terminal, said negative terminal being connected to said point of fixed reference voltage, a common feed resistor connected between said positive terminal and said plates, a negative feedback coupling means connected between said common output circuit and the control grid of the second of said pair of electronic tubes, an input circuit connected between the control grid of the first of said pair of electronic tubes and an intermediate point on said cathode impedance to impress a signal voltage upon the grid of said first of said pair of tubes, a pair of oppositely poled rectifiers, a rectifier driver amplifier circuit connected between said common output circuit and said oppositely poled rectifiers, and a resistor-capacitor network connected to each of said rectifiers for deriving control voltages, one of said networks being connected between the control grid of the first of said pair of electronic tubes and said intermediate point on said cathode impedance, the other of said networks being connected between the control grid of the second of said pair of electronic tubes and said point of fixed reference voltage, whereby said control voltage is applied to each of said electron tubes in opposite senses so that an increase in control voltage value decreases the conductance and plate current of the first tube but increases the conductance and plate current of the second tube and said tubes mutually cooperate to provide increased dynamic compression range and also to reduce the effect of said control voltages upon the common output circuit.

2. A dynamic compressor amplifier, as set forth in claim 1, in which said coupling means has frequency response characteristics adapted to vary the frequency characteristics of said compressor.

3. A dynamic compressor amplifier, as set forth in claim 1, in which said coupling means comprises a capacitor.

ELLISON S. PURINGTON.

REFERENCES CITED

The following references are of record in the file of this patent:

UNITED STATES PATENTS

| Number | Name | Date |
|---|---|---|
| 2,069,869 | Yolles | Feb. 9, 1937 |
| 2,251,594 | Mayne | Aug. 5, 1941 |
| 2,368,453 | Deerhake | Jan. 30, 1945 |
| 2,495,390 | Shimek | Jan. 24, 1950 |